US009099480B2

(12) United States Patent
Freguglia et al.

(10) Patent No.: US 9,099,480 B2
(45) Date of Patent: Aug. 4, 2015

(54) INDEXING OF ELECTRONIC DEVICES DISTRIBUTED ON DIFFERENT CHIPS

(75) Inventors: Alessandro Freguglia, Bollate (IT); Luca Pividori, Curno (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 665 days.

(21) Appl. No.: 12/895,515

(22) Filed: Sep. 30, 2010

(65) Prior Publication Data

US 2011/0073966 A1      Mar. 31, 2011

Related U.S. Application Data

(63) Continuation-in-part of application No. 12/883,972, filed on Sep. 16, 2010, now abandoned.

(30) Foreign Application Priority Data

Sep. 30, 2009   (IT) .......................... MI2009A001684

(51) Int. Cl.
   *H01L 29/84*      (2006.01)
   *H01L 23/544*    (2006.01)

(52) U.S. Cl.
   CPC .................................. *H01L 23/544* (2013.01)

(58) Field of Classification Search
   USPC .............. 257/415, E23.179, E29.324; 438/51
   See application file for complete search history.

(56) References Cited

U.S. PATENT DOCUMENTS

| 2003/0127718 | A1 | 7/2003 | Haag |
| 2003/0166313 | A1* | 9/2003 | Nishikawa et al. ........... 438/118 |

FOREIGN PATENT DOCUMENTS

| JP | 04340214 A | 11/1992 |
| JP | 2007-48989 | 2/2007 |
| JP | 2007-081123 | 3/2007 |
| WO | 0033360 A1 | 6/2000 |
| WO | 01/39269 | 5/2001 |

OTHER PUBLICATIONS

Search Report for Italian Application Serial No. MI20091684, Ministero dello Sviluppo Economico, Munich, Jul. 21, 2010, pp. 4.

* cited by examiner

*Primary Examiner* — Marvin Payen
(74) *Attorney, Agent, or Firm* — Gardere Wynne Sewell LLP

(57) ABSTRACT

An embodiment of a method is proposed for indexing electronic devices. The embodiment includes the steps of forming a plurality of first chips in a first wafer, forming a plurality of second chips in a second wafer, forming the electronic devices by coupling each first chip with a corresponding second chip, and forming an index on each electronic device; the index is indicative of a position of the corresponding first chip in the first wafer. In an embodiment, the step of forming an index includes forming a first portion of the index on the first chip, and forming a second portion of the index on the second chip.

26 Claims, 6 Drawing Sheets

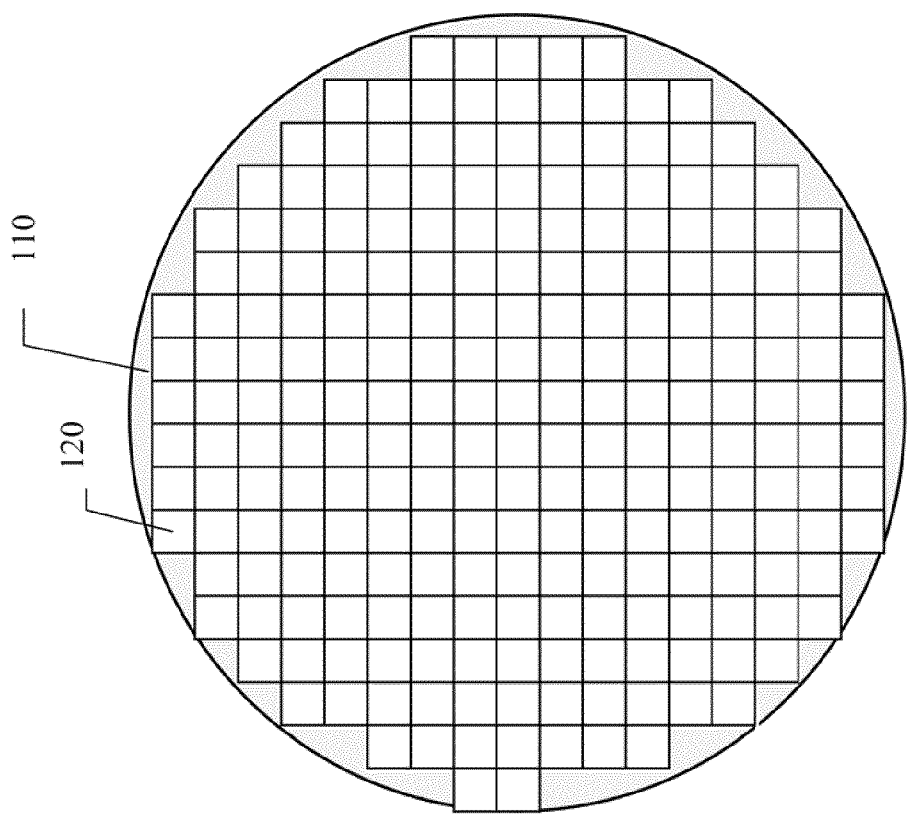
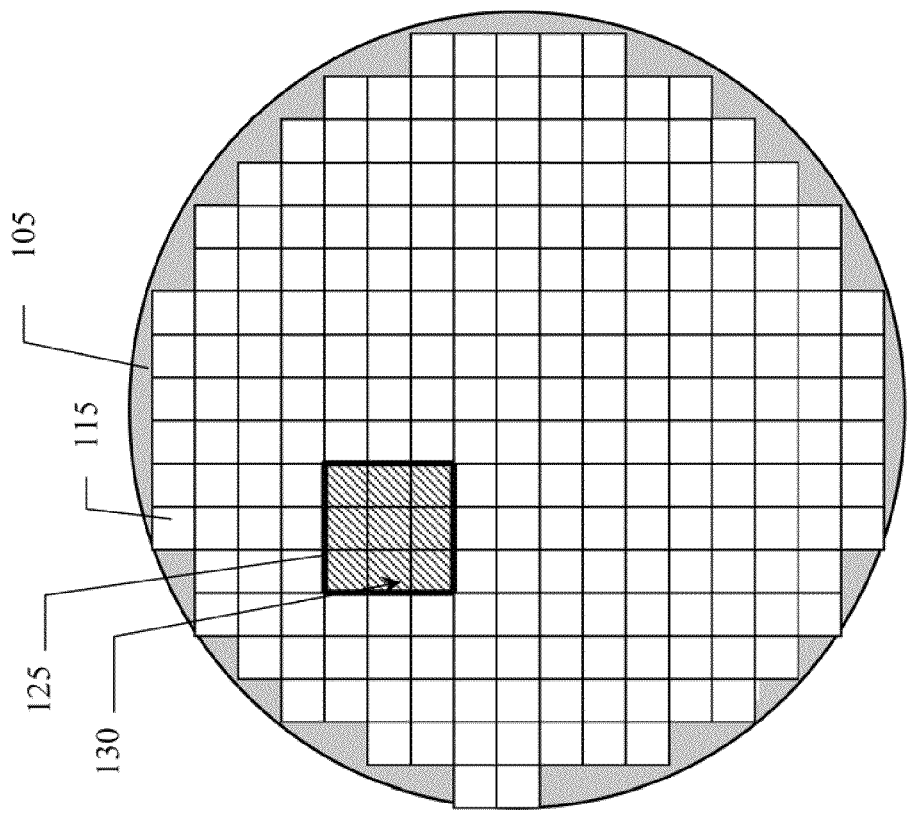
FIG.1

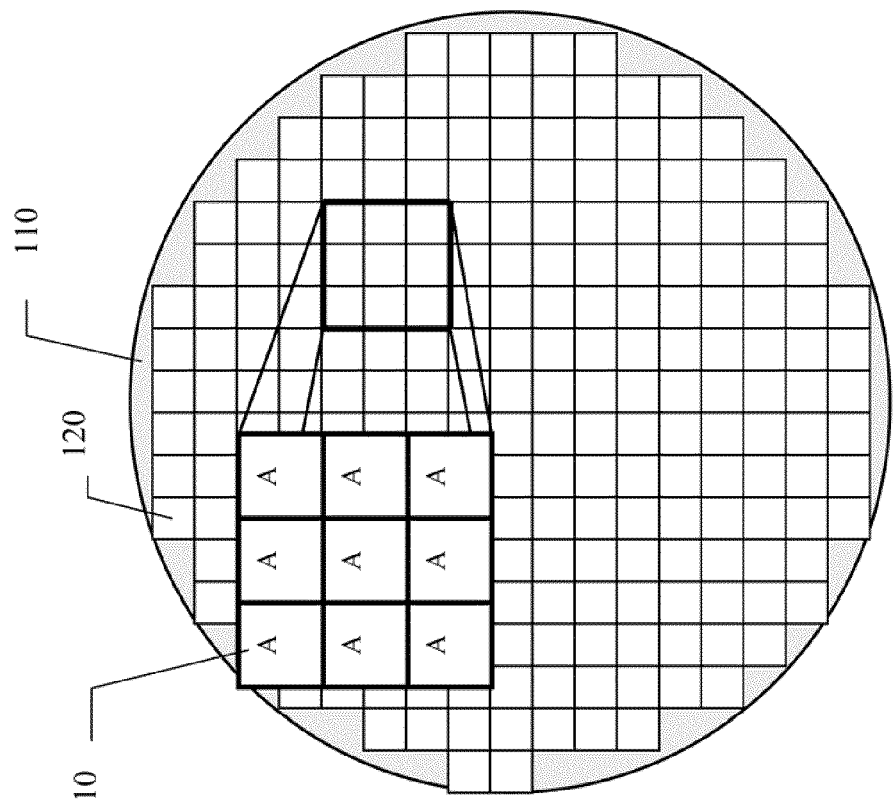
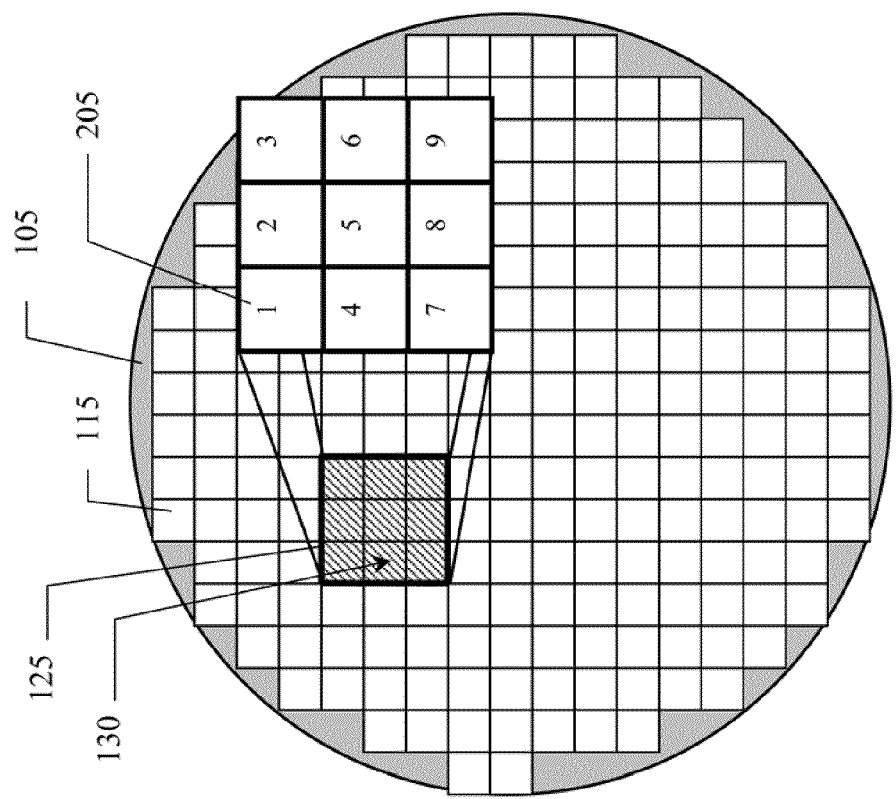
FIG.2

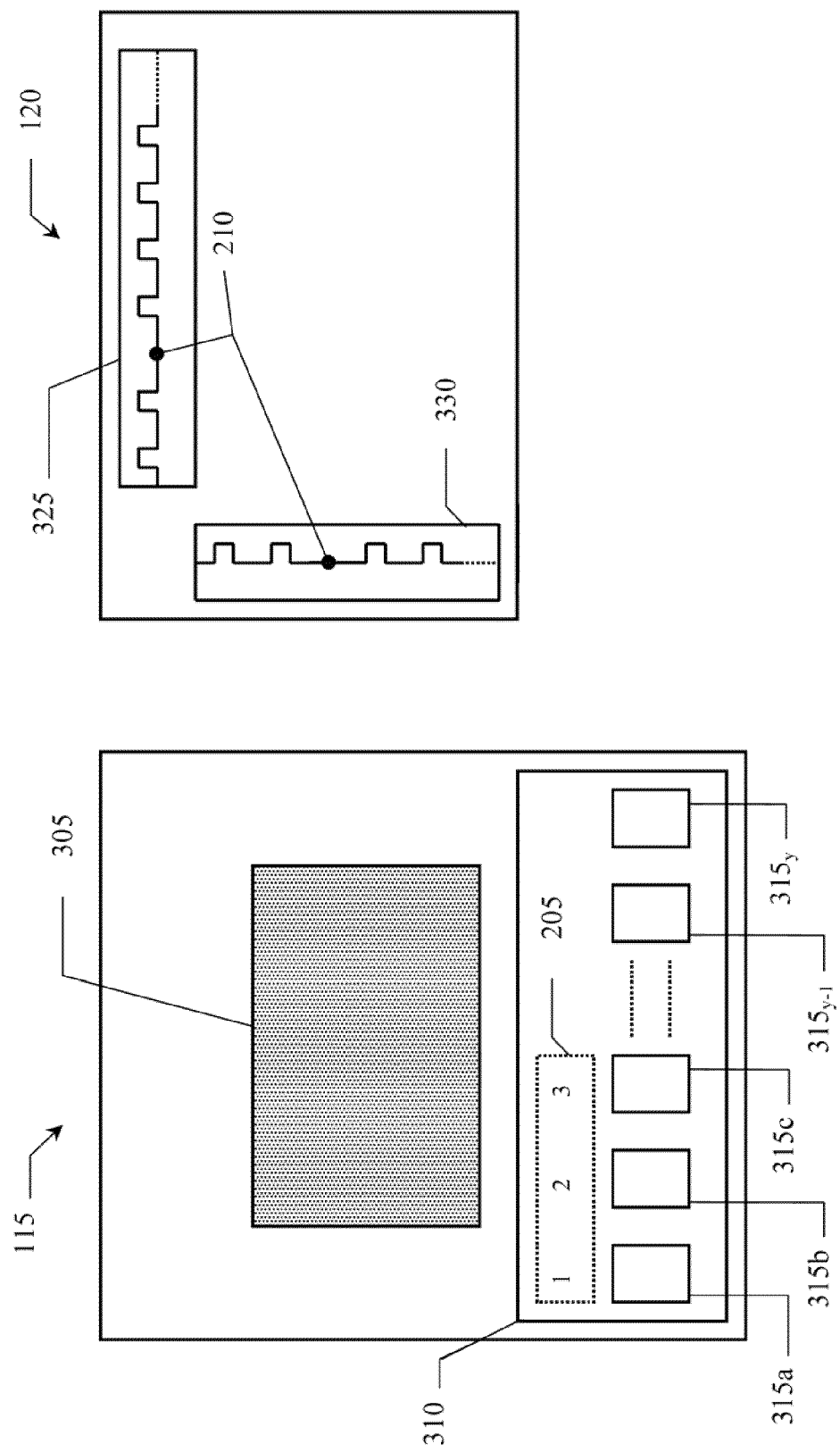

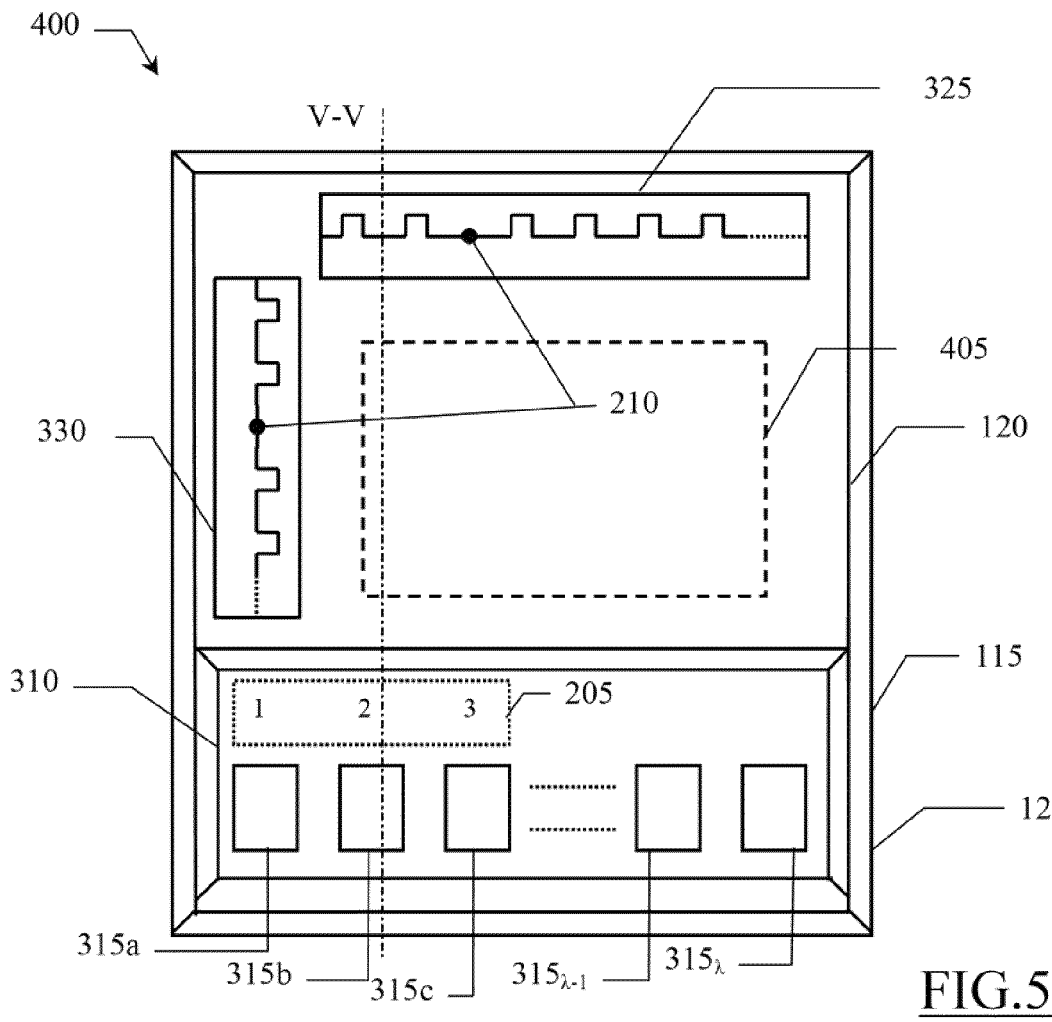
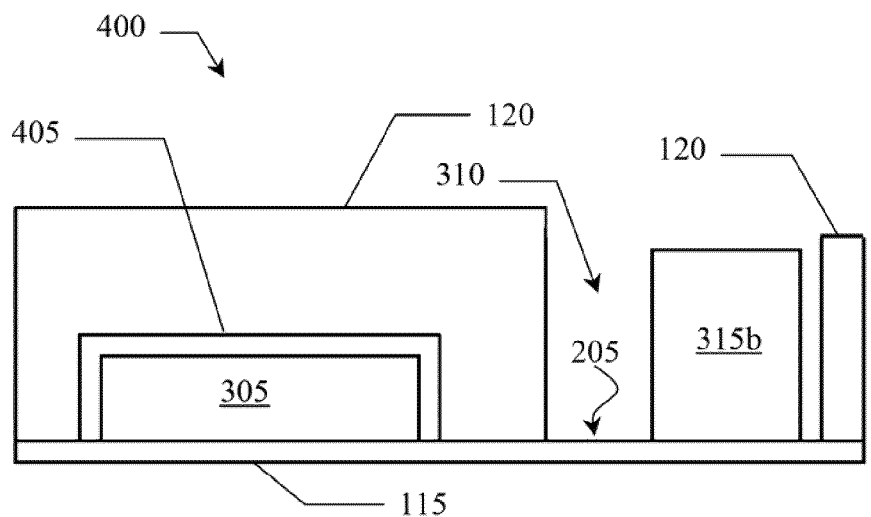
FIG.5B

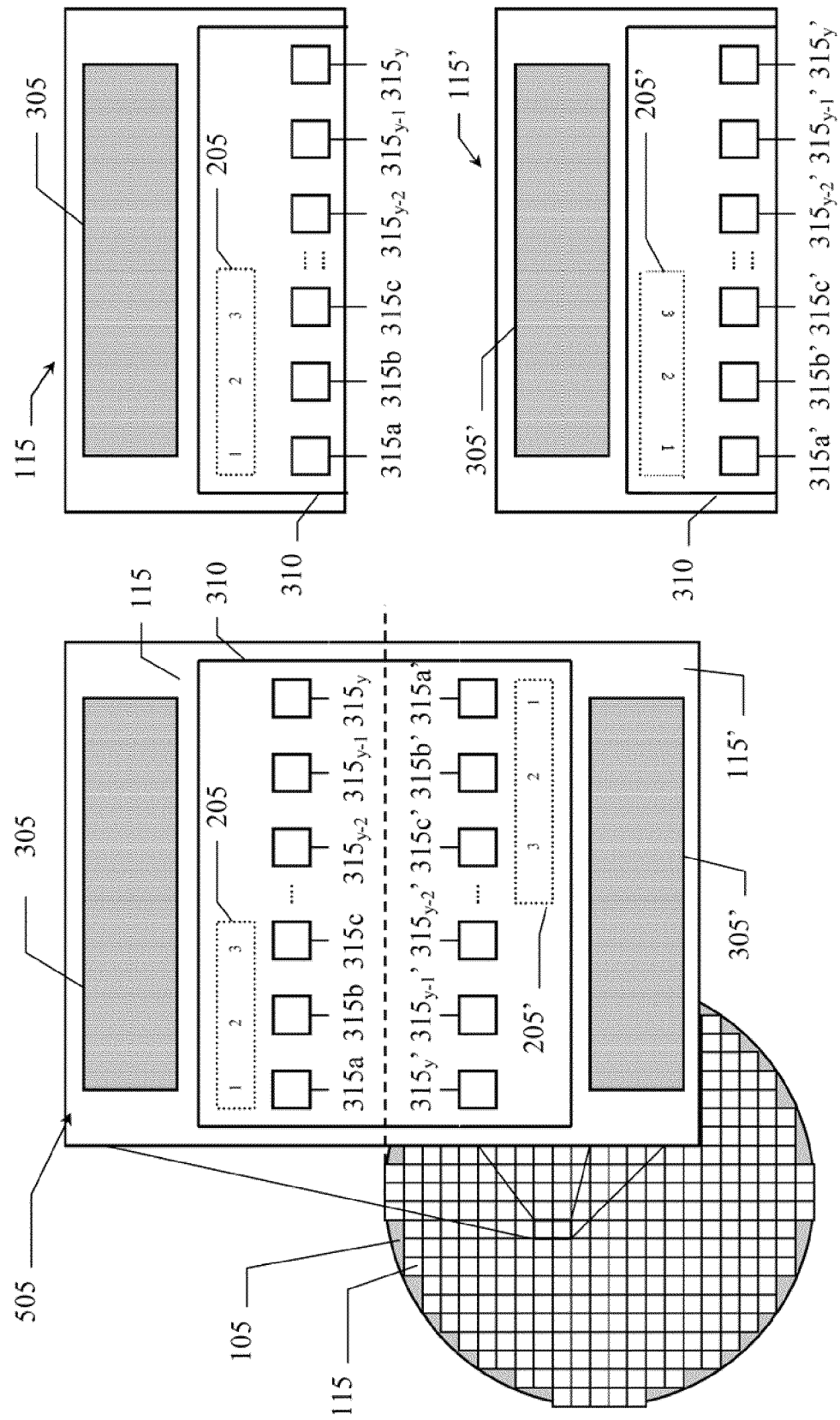

INDEXING OF ELECTRONIC DEVICES DISTRIBUTED ON DIFFERENT CHIPS

PRIORITY CLAIM

The present application is a Continuation-In-Part of Copending U.S. patent application Ser. No. 12/883,972 filed on Sep. 16, 2010, which application claims priority to Italian Patent Application No. MI2009A001684, filed Sep. 30, 2009, which applications are incorporated by reference in their entireties.

TECHNICAL FIELD

An embodiment generally relates to electronic devices, in particular, an embodiment relates to the indexing of the electronic devices.

SUMMARY

Electronic devices are typically integrated in chips of semiconductor material. The chips are formed in large numbers in a wafer of semiconductor material through a production process typically performed in a sequence of steps. At the end of this process, the wafer includes a plurality of chips (equal to each other) that are then separated by a cutting operation.

In particular, some classes of electronic devices are formed by two chips coupled to each other.

For example, a MEMS (Micro-Electro-Mechanical System) device is formed by a sensor chip, wherein there is implemented an electro-mechanical sensor, and by a cap chip, used to cover the sensor in order to protect it from the external environment.

The production process of such class of electronic devices involves the formation of a plurality of sensor chips on a wafer, and the formation of a corresponding plurality of cap chips on another wafer. A composite wafer is obtained from the union of these two wafers by overlapping them. The MEMS devices are then obtained by cutting the composite wafer at each pair of sensor chip and cap chip.

Should the MEMS devices be found defective before or during their use, they are returned to the manufacturer in order to carry out a failure analysis; therefore, the possibility of tracing the original position of the sensor chip in the corresponding wafer is of strategic importance for the management of the quality of the production process. In fact, functional parameters, performance and reliability of each sensor chip may vary even considerably as a function of its position in the wafer. For this reason, it is important for the manufacturer to know where to intervene for improving the quality of the production process.

For such purpose, it is known in the state of the art to provide on each sensor chip an index being indicative of its position within the corresponding wafer.

In particular, with the increase in the size of the wafers and with the increase of the integration capability of electronic devices, each step of the production process of the sensor chips through a proper photolithographic mask may no more be performed in only one step (so-called "one shot" mode) over the entire area of the wafer, but it is typically performed step by step (so-called "stepper shot" mode) on different portions of the wafer; at each step, the mask acts on a corresponding area of the wafer wherein there will be made, at the end of the process, a corresponding subset of sensor chips; the same operation is repeated until applying the same mask on the entire area of the wafer. In this case, the index of each sensor chip is formed by two portions. A first index portion (obtained through a specific mask) identifies the position of the sensor chip within the corresponding area of the wafer (being equal for the sensor chips placed in corresponding positions in the different areas because of the repeated use of the same mask). A second portion of the index (obtained by known techniques of direct writing on wafer, for example, laser-based) then identifies the area of the wafer in which the sensor chip is formed.

In any case, the integration capability of the sensor chips required by the current design specifications is such that the number of sensor chips integrated in each wafer grows significantly; therefore, the number of sensor chips to be indexed being greater and greater, the index will be longer and longer. However, an increasing length of the index is inconsistent with the miniaturization of electronic devices because the length of the index may significantly affect the size of the sensor chips and, ultimately, of the corresponding electronic devices.

The problem is exacerbated by the fact that often, for facilitating the identification of the index portions, the two index portions are written in different regions of the sensor chip. Since such regions are properly spaced from the active areas of the sensor chip for avoiding damages during the writing of the index, this technique may cause further increases in the size of the electronic devices.

Other indexing techniques are known in the art.

For example, the document JP 2007 081123, which is incorporated by reference, discloses a chip being provided with a chip position identification pattern including information indicating the positions of a plurality of chip patterns in a reticle to be used in stepper lithography, and other information indicating the positions of exposure shots repeated across the semiconductor wafer. But such document does not face nor solve the above-mentioned problems relating to excessively long indexes with respect to the chip size.

The document US 2003/166313, which is incorporated by reference, discloses a semiconductor element mounting method providing for the possibility of superimposing different chips to each other at a wafer level.

The document US 2003/127718, which is incorporated by reference, discloses a semiconductor component and a method for identifying a semiconductor component that comprises at least one semiconductor substrate equipped with electronic/electromechanical components, which semiconductor substrate—except for its leads—is embedded in a housing part made of plastic.

The document WO 01/39269, which is incorporated by reference, discloses a system for making small modifications to the pattern in standard processed semiconductor devices, such modifications being made to create a small variable part of the pattern against a large constant part of the same pattern.

In its general terms, an embodiment is based on the idea of distributing the index on different chips concurring to the formation of the electronic devices.

More specifically, an embodiment is a method for indexing electronic devices. The method includes the steps of forming a plurality of first chips in a first wafer, forming a plurality of seconds chips in a second wafer, forming the electronic devices by coupling each first chip with a corresponding second chip, and forming an index on each electronic device; the index is indicative of a position of the corresponding first chip in the first wafer. In an embodiment, the step of forming an index includes forming a first portion of the index on the first chip, and forming a second portion of the index on the second chip.

Another embodiment is a corresponding electronic device.

BRIEF DESCRIPTION OF THE DRAWINGS

One or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this regard, it is expressly intended that the figures are not necessarily drawn to scale and that, unless otherwise indicated, they are simply used to conceptually illustrate the described structures and procedures. In particular:

FIG. 1 schematically shows the structure obtained at an intermediate step of a production process of conventional MEMS devices;

FIG. 2 shows, in a simplified way, an indexing method of the MEMS devices of FIG. 1 according to an embodiment;

FIG. 3 schematically shows an implementation of the indexing method of FIG. 2 according to an embodiment;

FIG. 5A and FIG. 5B schematically show a plant view and a cross-section view, respectively, of an embodiment of the MEMS device of FIG. 4A at another step of a manufacturing process thereof; and FIGS. 6A and 6B schematically show an implementation of the indexing method of FIG. 2 according to another embodiment.

DETAILED DESCRIPTION

Figure 4A:
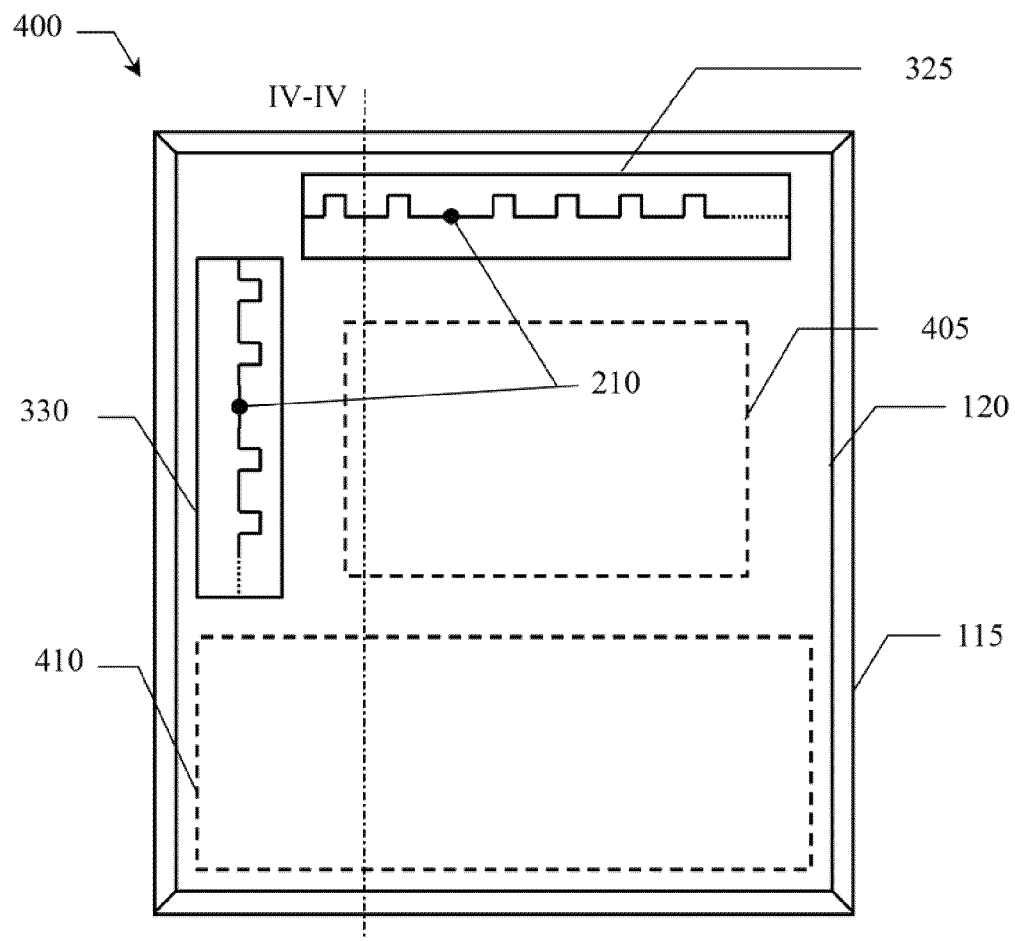
FIG. 4A and FIG. 4B schematically show a plant view and a cross-section view, respectively, of a MEMS device implementing an embodiment of the indexing method described at a step of a manufacturing process thereof.

Considering in particular FIG. 1, there is schematically shown the structure obtained at an intermediate step of a production process of conventional MEMS devices. In particular, the MEMS devices are formed on two wafers, a sensor wafer 105 and a cap wafer 110, including a plurality of electronic sensors (each one of them defining a corresponding sensor chip 115 once cut) and a plurality of caps (each one of them defining a corresponding cap chip 120 for a sensor chip 115 once cut), respectively.

The cap chips 120 are formed on the cap wafer 110 through the use of proper masks (not shown in the figure) in the one shot mode (that is, each mask covers a whole surface of the cap wafer 110). Instead, the sensor chips 115 are not formed on the wafer 105 in the one shot mode; in fact, the sensor chips 115, including electronic and mechanical circuits inside them, are more complex to implement than the cap chips 120 are, since they require a high integration capability. Such integration may not be effective if the wafer size increases, for the same process masks being used; the masks are then applied in an area 125 of the sensor wafer 105, which identifies a stepper: within each region 125 a subset of sensor chips 130 is formed according to the classic procedure (only nine shown in the figure for simplicity, but potentially in very larger number in reality). Repeating such operations also for the other areas of the surface of the sensor wafer 105, it is obtained that on the whole surface of the sensor wafer 105 the desired plurality of sensor chips 115 will be formed.

At this point, the cap wafer 110 is inverted and superimposed on the sensor wafer 105 (obtaining a composite wafer, not shown in the figure) so as to cover each sensor chip 115 with the corresponding cap chip 120; each cap chip 120 is then bonded to the corresponding sensor chip 115.

Then, the composite wafer, being obtained from the union of the sensor wafer 105 with the cap wafer 110, is cut at each sensor chip 115, thus obtaining the desired MEMS devices.

Each MEMS device is identified by an index that identifies the position of its sensor chip 115 in the sensor wafer 105, and thus also of its cap chip 120 in the cap wafer 110.

In an embodiment (as described in detail below) such index is distributed partly on the sensor chip 115 and partly on the cap chip 120.

In this way, each one of the sensor chip 115 and the cap chip 120 has a corresponding index portion, which takes an area of the chip 115, 120 being certainly lower than that taken by the whole index only on the sensor chip 115; therefore, the minimization of the size of the sensor chip 115 is not impeded, and hence of the whole MEMS device, is not penalized.

Furthermore, the index portion being written on the cap chip 120 does not pose any problem of damage to the sensor chip 115 during the writing step.

Finally, an embodiment facilitates the localization of the two index portions without the need of increasing the size of the sensor chip 115.

Turning now to FIG. 2, there is shown, in a simplified way, an indexing method of the MEMS devices of FIG. 1 according to an embodiment.

On each sensor chip 115 there is written a first index portion 205 that identifies the sensor chip 115 within the corresponding area 125; in order to illustrate this conceptually, in FIG. 2 such index is represented exemplarily by numbers (1, 2, 3, 4, 5, 6, 7, 8, 9) corresponding to the limited number (nine, precisely) of sensor chips 115 represented in an exemplary way in each area 125. Such first index portion 205 is the same for the sensor chips 115 (of the various subsets 130) that are located in the same position within the corresponding area 125.

On each cap chip 120 there is written a second index portion 210 (represented, for simplicity by letters A, B, C, and so on) being indicative of a position of the area 125 of the corresponding subset of the sensor chips 130 in the sensor wafer 105; such second index portion 210 is the same for the cap chips 120 whose sensor chips 115 of a same subset 130 are included in a same area 125. It is noted that since the composite wafer is obtained by overturning the cap wafer 110 and overlapping it to the sensor wafer 105, the second index portions 210 may be written in areas of the cap wafer 110 located in mirror positions with respect to the positions of the areas 125 in the sensor wafer 105.

Each MEMS device is therefore identified by the first index portion 205 of its sensor chip 115 (indicating the position of the sensor chip 115 of the subset 130 within the corresponding area 125) and by the second index portion 210 of its cap chip 120 (indicating the position of the area 125 of the subset 130 of sensor chips within the sensor wafer 105). For example, the index A4 will indicate the fourth sensor chip 115 of a specific area 125, B3 the third sensor chip 115 of another specific area 125, C1 the first sensor chip 115 of a further specific area 125, and so on.

Turning now to FIG. 3, there is schematically shown an implementation of the indexing method of FIG. 2 according to an embodiment.

In particular, in FIG. 3 there is shown an implementation of the indexing method of FIG. 2 of the generic sensor chip 115 (leftward), and the corresponding cap chip 120 (both the sensor chip 105 and the cap chip 120 being depicted in a plant view for simplicity).

The sensor chip 115 includes an active section 305 in which there is formed the electro-mechanical device, and a terminal section 310 in which there is formed a plurality of contacts ($315a$, $315b$, $315c$, $305_{y-1}$, $315_y$) being adapted to couple the active area 305 with an external device (not shown in the figure).

In a known manner, the cap chip 120 covers the whole active section 305 (so as to protect the electro-mechanical device), but not the terminal section 310 (so as to leave uncovered the contacts $315a$, $315b$, $315c$, $305_{y-1}$, $315_y$).

The first index portion 205 on the sensor chip 115 is formed by a set of digits (for example, three); such digits are written in the terminal section 310, with each digit near a corresponding contact (for example, the first three contacts $315a$, $315b$, $315c$). In the example in the figure, the first index portion 205 has the value 123 (for indicating the one-hundred-twenty-third sensor chip 115 in the corresponding area).

The second index portion 210 on the cap chip 120 instead implements a (row and column) coordinates system being adapted to identify the position of the corresponding area of the sensor wafer.

A row coordinate of the second index portion 210 is obtained from a row string 325 including a plurality of row dots (for example, 1,000 dots with a diameter of 5 μm and a spacing of 10 μm); the value of the row coordinate is defined in the string 325 by the position of a missing dot.

Similarly, a column coordinate is obtained from a column string 330 including a plurality of column dots: the value of the column coordinate is defined in the string 330 by the position of a missing point.

In the example in the figure, both the row string 325 and the column string 330 have a missing dot in the position 2; therefore, the coordinates forming the second index portion 210 are (2; 2), indicating the area in the second row and in the second column of the sensor wafer.

Figure 4B:
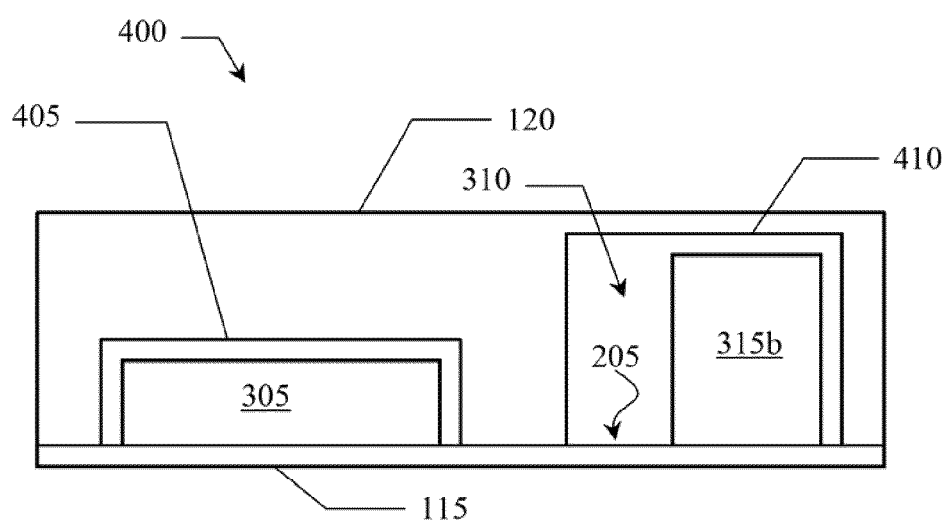

FIG. 4A and FIG. 4B schematically show an embodiment of a MEMS device 400 implementing an embodiment of the indexing method described in FIG. 3 at a step of a manufacturing process thereof; particularly, FIG. 4A shows the MEMS device 400 in plant view and FIG. 4B shows a cross-section view of the same MEMS device 400 along the IV-IV axis of FIG. 4A. In this phase, each cap chip 120 of the cap wafer is superimposed over the corresponding sensor chip 115 so as to cover it completely (in the following, only one sensor chip 115 and one cap chip 120 will be considered for simplicity, but it is clear that the MEMS devices are formed at a wafer level concurrently). As can be seen, a rear part of the cap chip 120 facing the sensor chip 115 is provided with two blind recesses 405 and 410; the recesses 405 and 410 are both formed (in the cap wafer) in a known manner at a proper step of the production process (e.g., before or after forming the second index portions 210). The recess 405 substantially completely covers the active section 305 of the sensor chip 115, whereas the recess 410 completely covers the terminal section 310 thereof that include the contacts (whose only the contact $315b$ is visible) and the first index portion 205—with the recess 410 that is deeper than the recess 405. Therefore, at such intermediate condition, only the second index portion 210 of the MEMS device 400 is visible (while the first index portion 205 is covered by the cap chip 120).

A front of the cap chip 120 associated to the recess 410 is then subjected to a (known) localised Chemical Mechanical Polishing/Planarization operation (or other similar or equivalent operations) acting selectively thereon, until the 410 recess is opened.

In this way, as visible in FIG. 5A and FIG. 5B (schematically showing the same MEMS device 400 at another step of its manufacturing process in plant view and in cross-section view along the V-V axis of FIG. 5A, respectively) the terminals section 310 and the first index portion 205 of the sensor chip 115 are uncovered.

Alternatively, it may be possible to perform the Chemical Mechanical Polishing/Planarization operation on the whole cap wafer (thus making the production process easier), by stopping it (after the recess 410 has been opened) before reaching the recess 405. In this case, the second index portion 210 is formed on the cap chip 120 after its planarization (at the level of the cap wafer).

Anyway, regardless of the disclosed exemplary and no limiting production processes being usable to make the MEMS device 400, an embodiment of the MEMS device 400 thereby obtained is such that the index portion 205 formed in the sensor chip 115 and the index portion 210 formed in the cap chip 120 are both visible and detectable through known techniques—for example, by X-ray microscope reading.

The use of an index formed by two portions 205, 210 distributed on two different chips 115, 120 may be advantageous since such index portions 205, 210, being suitable to be located in arbitrary positions within the corresponding chip 115, 120, are arranged in such a way to exploit pre-existing areas (possibly unused) of the chip 115, 120 without the excessive length of the index being incompatible with the demands of miniaturization of the MEMS device 400. In this way, the minimizing of the size of the chips 115, 120, and hence of the whole MEMS device 400, is not penalized.

In FIGS. 6A and 6B there is shown an implementation of the indexing method of FIG. 2 according to another embodiment.

In particular, in FIG. 6A there is again shown the sensor wafer 105 with a plurality of sensor chips 115 that are arranged in the sensor wafer 105 in another conventional manner.

Such embodiment differs from that shown in FIG. 3 substantially by the different mutual orientation of two (or more) adjacent sensor chips 115. The sensor chips are distributed on the sensor wafer 105 in such a way that each sensor chip 115 is rotated by 180° with respect to the immediately preceding sensor chip and the immediately following sensor chip, and with respect to the sensor chip immediately above and the sensor chip immediately below. In particular, as shown in FIG. 6A for a generic and exemplary pair 505 of sensor chips 115 and 115', the sensor chip 115 is rotated by 180° with respect to the adjacent sensor chip 115' below it (hereinafter, the components of the sensor chip 115' are indicated with the same references of the corresponding components of the sensor chip 115 with the addition of an apex). Such structure is commonly implemented for avoiding possible breakages of the sensor wafer 105; in fact, since the sensor chips 115, 115' have areas of different weight (the active section 305, 305', the terminal section 310, 310' and an unused area), an identical arrangement of the sensor chips 115, 115' on the sensor wafer 105 may cause structural damages of the sensor wafer 105 itself since the weight of all the sensor chips 115, 115' is not distributed uniformly on the sensor wafer 105 but it is concentrated in certain areas thereof.

In such case, in an embodiment, it is possible to write a first index portion 205 on first three contacts $315a$, $315b$, $315c$ of the sensor chip 115 (in the sensor wafer 105, from left to right, at the top), and a first index portion 205' having the same digits of the first index portion 205 on first three contacts $315a'$, $315b'$, $315c'$ of the sensor chip 115' (in mirrored position in the sensor wafer 105, from right to left, at the bottom).

During reading of the index on the sensor chips 115 and 115' being formed by cutting each pair 505 along its own axis (dashed line in FIG. 6A), an arbitrary predefined common orientation is assumed, as shown in FIG. 6B. In the example in the figure, the reading of the index is performed by placing the sensor chip 115, 115' with the corresponding terminals section 310, 310' oriented downward; in this way, the sensor chip 115 is marked by the index portion 205 (on the first three contacts 315*a*, 315*b*, 315*c*) having value 123, so that it will be read as the one-hundred-twenty-third sensor chip 115 within the corresponding area of the sensor wafer 105; instead, the sensor chip 115' is marked by the index portion 205', which is in the same position on the first three contacts 315*a*', 315*b*', 315*c*' once arranged according to the predefined common orientation chosen for the reading of the index. The index portion 205' has again the value 123, but with the corresponding digits over-turned vertically; therefore, such value will be read as a different position of the sensor chip 105' within the corresponding area of the sensor wafer 105 (for example, equal to the value of the index portion 205 added to the half of the sensor chips formed within the area of the sensor wafer 105).

An embodiment is advantageous since the use of over-turned alphanumeric characters allows achieving a doubling of the number of indexable electronic devices with the same number of characters: in particular, each index, including at least two possible orientations, allows indexing at least two electronic devices.

Naturally, in order to satisfy local and specific requirements, may apply to the embodiments described above many logical and/or physical modifications and alterations. More specifically, although certain embodiment(s) have been discussed, it is understood that various omissions, substitutions and changes in the form and details as well as other embodiments may be possible; moreover, it is expressly intended that specific elements and/or method steps described in connection with any disclosed embodiment may be incorporated in any other embodiment as a matter of general design choice.

For example, an embodiment lends itself to be implemented with an equivalent method (by using similar steps, removing some steps being non-essential, or adding further optional steps); moreover, the steps may be performed in a different order, concurrently or in an interleaved way (at least in part). Particularly, nothing prevents from forming the sensors chips and the cap chips directly (by dicing the sensor wafer and the cap wafer, respectively), and then coupling each cap chip with the corresponding sensor chip individually.

Similar considerations apply if the index includes more than two portions, properly distributed on the two chips.

Moreover, nothing prevents that the electronic device may include more than two chips coupled to each other (each one of them, or some but not all of them, including a corresponding index portion).

The same considerations apply if the index portions implement a different coordinate system, for example a mapping of the chip, or if such coordinates are written with non-alphanumeric characters, for example using Morse or Braille codes.

Nothing prevents that the index portions may be formed by numerical characters in a non-decimal base (for example, in hexadecimal base), or by alphanumeric characters, including, for example, the ten numbers from 0 to 9 and the twenty-six letters from A to Z, for increasing the number of indexable devices.

The index may be distributed on two chips in any other way (for example, in case of an index that identifies the absolute position of the chip in the wafer, it is possible to write its most significant digits on a chip and its least significant digits on the other chip).

Although an embodiment has been described with reference to electronic devices whose chips are formed one in stepper shot mode and the other in one shot mode, this should not be interpreted in a limitative way (an embodiment may be applied even when the two chips are both formed in stepper shot or one shot mode). Moreover, an embodiment may be applied even in case of use of different lithographic techniques.

An embodiment lends itself to be applied to any other type of electronic device (including electronic devices being not of the MEMS type).

The same considerations apply if the arrangement of the index portions is different; for example, they may be arranged on more free areas of the chip in order to maximize the exploitation of the area of the chip and to avoid possible damages of the contacts when writing the index. Alternatively, the indexes (or parts thereof) may also be not directly visible; in this case, the indexes are read with non-optical techniques (for example, echo-techniques when they are defined by corresponding notches).

In any case, it may be possible to produce the electronic device in a different way. For example, nothing prevents removing part of the cap wafer with other techniques, or forming the recesses with different shape, size and/or depth (for example, with the recesses that may have the same depth when a localized planarization operation is performed). Alternatively, it is also possible to form a through-hole on each cap chip (when in the cap wafer), so as to leave the terminals section of the corresponding sensor chip directly uncovered when the cap wafer is coupled with the sensor wafer.

The feature of using same index portions with different reciprocal orientation may be applied to groups of more chips (for example, four); similarly, same index portions may be diversified by other orientations of the digits included therein (for example, by overturning the digits by 90°, 180° and 270° on different chips), or by combinations thereof.

Similar considerations may apply if the electronic devices have a different structure or include equivalent components (either separately or in combination with each other). In particular, an embodiment is not limited to the material of the wafer (in this case, silicon), but it may be applied to chips made on substrates of any other material (for example, quartz and plastic).

An embodiment of the proposed structure may be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, the proposed electronic device may be mounted in intermediate products (such as mother boards) and coupled with one or more other chips (such as a processor or a memory). In any case, the integrated circuit may be suitable to be used in complex systems (such as logic computers).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electronic device comprising:
   a first chip associated with information corresponding to a location on a wafer from which the first chip originated;
   a second chip coupled with the first chip; and
   an index indicative of the information;
   wherein the index includes a first portion on the first chip and a second portion on the second chip.

2. The electronic device according to claim 1, wherein the electronic device is a Micro-Electro-Mechanical device, the first chip including sensor means and the second chip including a cover for protecting the sensor means.

3. The electronic device according to claim 1, wherein the first portion of the index is defined by a value thereof and an orientation thereof with respect to a common reading reference of the first chips.

4. An integrated circuit, comprising:
   a first die;
   a second die;
   a first identifier located on the first die; and
   a second identifier located on the second die, the first and second identifiers together indicating a wafer location from which at least one of the first and second dies originated such that the first and second identifiers individually cannot indicate a wafer location from which at least one of the first and second dies originated.

5. The integrated circuit of claim 4 wherein one of the first and second dies is disposed over the other of the first and second dies.

6. The integrated circuit of claim 4 wherein the first and second dies originated from respective wafers.

7. The integrated circuit of claim 4 wherein the first and second dies originated from a same wafer.

8. The integrated circuit of claim 4 wherein:
   the first identifier indicates a wafer region from which at least one of the first and second dies originated; and
   the second identifier indicates a section of the wafer region from which the at least one of the first and second dies originated.

9. The integrated circuit of claim 4 wherein the first and second identifiers together indicate respective wafer locations from which the first and second dies originated.

10. The integrated circuit of claim 4 wherein the first and second identifiers together indicate respective wafer locations of different wafers from which the first and second dies originated.

11. The integrated circuit of claim 4 wherein:
   one of the first and second identifiers comprises a row indicator and a column indicator that together indicate a row and column location of a wafer region; and
   the other of the first and second identifiers comprises a number that indicates a section of the wafer region.

12. The integrated circuit of claim 4 wherein at least one of the first and second identifiers comprises a number including at least one reverse digit.

13. The integrated circuit of claim 4 wherein:
   one of the first and second dies comprises a microelectromechanical device; and
   the other of the first and second dies comprises a cover for the microelectromechanical device.

14. An integrated-circuit die, comprising:
   a wafer-origination location having multiple coordinates, each of the multiple coordinates used to indicate a wafer-origination location of one and only one integrated circuit die; and
   at least one, but fewer than all, of the coordinates disposed on the one and only one integrated circuit die.

15. The integrated-circuit die of claim 14 wherein:
   the wafer-origination location has a region coordinate and a region-section coordinate; and
   only the region coordinate is disposed on the die.

16. The integrated-circuit die of claim 14 wherein:
   the wafer-origination location has a region coordinate and a region-section coordinate; and
   only the region-section coordinate is disposed on the die.

17. The integrated-circuit die of claim 14 wherein a row coordinate and column coordinate are disposed on the die, the row and column coordinates together indicating a wafer region of the wafer-origination location.

18. The integrated-circuit die of claim 14 wherein a row coordinate and column coordinate are disposed on the die, the row and column coordinates together indicating a wafer region of the wafer-origination location, the row and column coordinates not indicating a section of the wafer region.

19. The integrated-circuit die of claim 14, further comprising a microelectromechanical device.

20. The integrated-circuit die of claim 14, further comprising a cover.

21. A system, comprising:
   a first integrated circuit, comprising:
      a first die;
      a second die;
      a first identifier located on the first die; and
      a second identifier located on the second die, the first and second identifiers together indicating a wafer location from which at least one of the first and second dies originated such that the first and second identifiers individually cannot indicate a wafer location from which at least one of the first and second dies originated; and
   a second integrated circuit coupled to the first integrated circuit.

22. The system of claim 21 wherein the second integrated circuit is disposed on at least one of the first and second dies.

23. The system of claim 21 wherein the second integrated circuit is disposed on a third die.

24. The system of claim 21 wherein the first integrated circuit comprises a microelectromechanical device.

25. The system of claim 21 wherein:
   the first die comprises a microelectromechanical device; and
   the second die comprises a cover disposed over the first die.

26. The system of claim 21 wherein the second integrated circuit comprises a controller.

* * * * *

UNITED STATES PATENT AND TRADEMARK OFFICE
CERTIFICATE OF CORRECTION

PATENT NO. : 9,099,480 B2  
APPLICATION NO. : 12/895515  
DATED : August 4, 2015  
INVENTOR(S) : Alessandro Freguglia et al.

Page 1 of 1

It is certified that error appears in the above-identified patent and that said Letters Patent is hereby corrected as shown below:

On the Title Page:

In Item (30) the foreign application number should be corrected as follows:

(30) Foreign Application Priority Data

Sep. 30, 2009 (IT) ............ [MI2009A001684] -- MI2009A001684 --

Signed and Sealed this
Fifteenth Day of December, 2015

Michelle K. Lee
*Director of the United States Patent and Trademark Office*